United States Patent
Hu et al.

(10) Patent No.: US 6,894,352 B2
(45) Date of Patent: May 17, 2005

(54) SINGLE-ELECTRON TRANSISTOR AND FABRICATION METHOD THEREOF

(75) Inventors: Shu-Fen Hu, 4F, No. 6, Lane 281, Dongnan St., Hsinchu City, 300 (TW); Yung-Chun Wu, Taipei (TW); Wen-Tai Lu, Tainan (TW); Shiue-Shin Liu, Hsinchu (TW); Tiao-Yuan Huang, Hsinchu (TW); Tien-Sheng Chao, Hsinchu (TW)

(73) Assignee: Shu-Fen Hu, Hsinchu (TW)

( * ) Notice: Subject to any disclaimer, the term of this patent is extended or adjusted under 35 U.S.C. 154(b) by 0 days.

(21) Appl. No.: 10/602,890

(22) Filed: Jun. 25, 2003

(65) Prior Publication Data

US 2004/0061173 A1 Apr. 1, 2004

(30) Foreign Application Priority Data

Jul. 4, 2002 (TW) ........................................ 91114853 U (51) Int. Cl.[7] .............................................. H01L 27/01
(52) U.S. Cl. ............................ 257/347; 257/9; 257/24; 257/321; 438/264; 438/257; 438/947
(58) Field of Search .............................. 257/9, 24, 321, 257/347; 438/264, 257, 947

(56) References Cited

U.S. PATENT DOCUMENTS 6,010,934 A * 1/2000 Wu .............................. 438/264

* cited by examiner

Primary Examiner—David Nelms
Assistant Examiner—Mai-Huong Tran
(74) Attorney, Agent, or Firm—Birch, Stewart, Kolasch & Birch, LLP.

(57) ABSTRACT

A method for fabricating a single-electron transistor (SET). A one dimensional channel is formed between source and drain on a silicon-on-insulator substrate, and the separated polysilicon sidewall spacer gates are formed by electron-beam lithographically etching process in a self-aligned manner. Operation of the single-electron transistor with self-aligned polysilicon sidewall spacer gates is achieved by applying external bias to the self-aligned polysilicon sidewall spacer gates to form two potential barriers and a quantum dot capable of storage charges between the two potential barriers. A metal upper gate is finally formed and biased to induce a two-dimensional electron gas (2DEG) and control the energy level of the quantum well. Accordingly, the method of the invention comprises a combination of electron beam (E-beam) lithography with multilayer-aligned direct writing technology, oxidation, and wet etching to form a nanoscale one-dimensional channel between source and drain on a silicon-on-insulator substrate.

4 Claims, 11 Drawing Sheets

SINGLE-ELECTRON TRANSISTOR AND FABRICATION METHOD THEREOF

BACKGROUND OF THE INVENTION

1. Field of the Invention

The invention relates to a fabrication method for a single-electron transistor (SET), and more particularly to a single-electron transistor with self-aligned sidewall spacer gates.

2. Description of the Related Art

As semiconductor technology continuously progresses toward a deep sub-micron regime, namely a nanometer scale regime, there has been a tremendous tendency to increase the integration densities of IC devices and decreasing the scale thereof. In general, the fabrication methods for a nanoscale device include an epitaxial growth technique, a self-assembly technology and a lithography process. The epitaxial growth technique is most suitable for III–V group compound semiconductor applications. The self-assembly technology using a natural rule of grain growth can form nano-size grains, but cannot control grain growth on a specific location and the amount of the grown grains. The lithography process has limitations in the apparatus light source, such that a poor resolution cannot fulfill requests for the width of a nanowire in a nano-level quantum device.

Choi et al. disclose "Fabrication of a dual-gate-controlled Coulomb blockade transistor based on a silicon-on-insulator structure" in 1998 Semicond. Sci. Technol. Electron-beam lithography has been employed to fabricate a gate-controlled single-electron transistor, but has disadvantages as follows. First, the electron-beam lithography has a proximity effect upon two separated under-gate patterns resulting in excess distance therebetween, reaching approximately 100 nm, thus the quantum well capacitor for storing charges is large and the single-electron effect is only measured at an extremely low temperature of about 15 mK. Second, use of electron-beam lithography and etching on the two separated under-gate patterns easily causes an asymmetric structure, resulting in some loss of electrical performance.

SUMMARY OF THE INVENTION

Accordingly, an object of the present invention is to provide a single-electron transistor with self-aligned polysilicon sidewall spacer gates serving as separated lower gates and fabrication method for thereof.

According to this invention, a new method of fabricating the single-electron transistor with self-aligned polysilicon sidewall spacer gates can further reduce space between the separated gates to 40 nm or less, reduce the capacitance of the quantum well, increase the operating temperature to room temperature, and also provide excellent symmetry of structure.

To achieve the above objective, the fabricating method of the invention comprises a combination of electron beam (E-beam) lithographical multilayer aligned direct writing technology, oxidation and dry/wet etching processes to form a nanometer scale one-dimensional channel between source and drain on a silicon-on-insulator substrate. Next, a one-dimensional silicon dioxide nano-wire intersecting the channel is formed. A polysilicon layer is further deposited and lithographically etched to form polysilicon sidewall spacer gates. Two potential barriers and a quantum dot capable of charge-storage are created by biasing the polysilicon sidewall spacer gates. Then, the dual-gate-controlled single electron transistor is operated by biasing the metal upper gate to induce a two-dimensional electron gas (2DEG) and by controlling the energy level of the quantum well.

The overall processes of the invention are compatible with the state-of-the-art VLSI technology and valuable for developing industrial applications.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The invention will be illustrated in detail by the following preferred embodiments with reference to the accompanying drawings.

Figure 1:
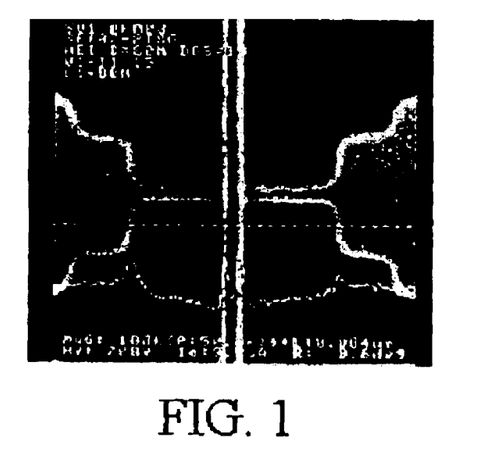
FIG. 1 is a SEM image of one-dimensional silicon dioxide nano-wire formed by electron-beam lithography and etching technology.

A nanoscale one-dimensional channel between source and drain on a silicon-on-insulator substrate can be created using electron-beam (E-beam) lithography with multilayer aligned direct writing technology, oxidation and wet etching processes. A one-dimensional silicon dioxide thin wire perpendicularly intersecting the channel is then formed by electron beam (E-beam) lithography and dipping in dilute HF solution to further reduce the width of one-dimensional silicon dioxide thin wire, as shown in FIG. 1. Two potential barriers and a quantum dot capable of charge-storage are created by biasing separated polysilicon sidewall spacer gates to complete a dual-gate controlled single-electron transistor.

Figure 2:
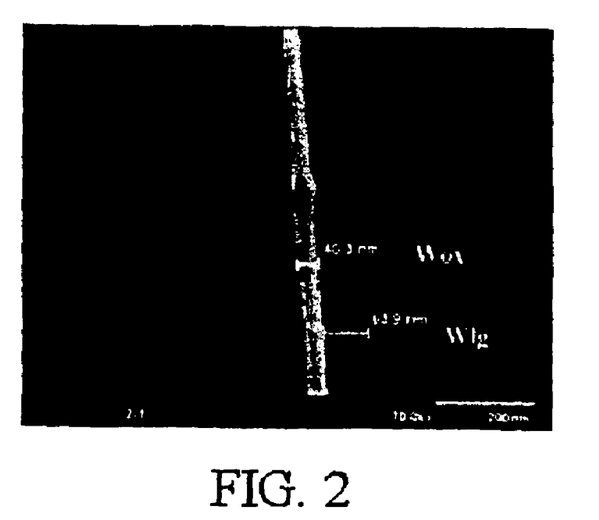
FIG. 2 is a SEM image of separated polysilicon spacer gates on a silicon-on-insulator substrate.

A fabrication method for a single electron transistor in accordance with an embodiment of the present invention is similar to a conventional method for fabricating a MOSFET. A substrate, such as 6" P-type silicon-on-insulator (SOI) wafer with a thin 550 Å silicon layer on top of a buried $SiO_2$, is provided. A dual-gate controlled single electron transistor comprises a source on the left, a drain on the right, and a one-dimensional channel between the source and the drain. A lower gate includes separated polysilicon spacer gates. A 5 nm thick silicon dioxide is interposed between the separated polysilicon spacer gates and the channel. Two potential barriers and a quantum dot capable of charge-storage between the two potential barriers are created by biasing the separated polysilicon spacer gates. A top metal gate is formed and biased to control the on/off state of the transistor and the quantum well energy level, thereby operating as a single electron transistor. A SEM image of the separated polysilicon spacer gates on the silicon-on-insulator substrate is shown in FIG. 2.

FIGS. 3–6 show the manufacturing progression of a single-electron transistor with self-aligned polysilicon sidewall spacer gates on the silicon-on-insulator (SOI) substrate according to one preferred embodiment of this invention.

Figure 3A:
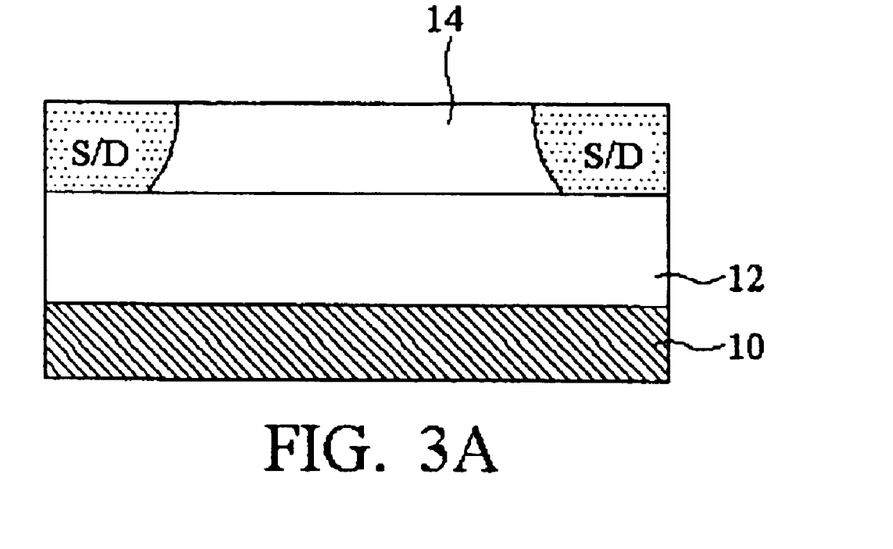
FIGS. 3–6 show manufacturing progression of a single-electron transistor with self-aligned polysilicon sidewall spacer gates on a silicon-on-insulator (SOI) substrate according to one preferred embodiment of this invention.
Figure 3B:
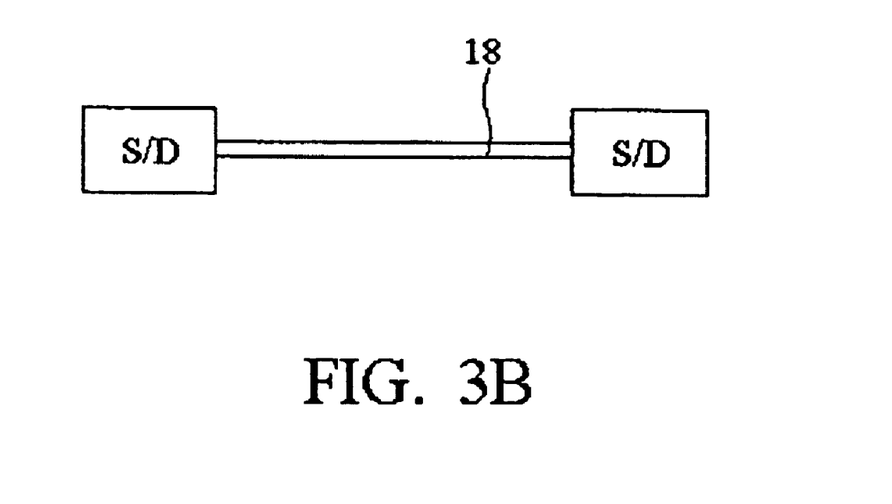

Referring now to FIGS. 3A and 3B (top view of FIG. 3A), a semiconductor layer 14 on top of a buried insulating layer 12 is formed on a semiconductor substrate 10. In one preferred embodiment of the present invention, starting silicon-on-insulator (SOI) can include, but is not limited to, SIMOX (separation by implantation of oxygen) technology or bonded SOI (SmartCut®) technology. The semiconductor layer 14 includes silicon having a thickness of about 1000 Å or less. The buried insulating layer 12 is made of silicon oxide. After depositing a 100 Å capping silicon dioxide layer (not shown) on the silicon layer 14, the top silicon layer 14 is doped by n+ or p+ ion implantation. The doping results in significant drop in the sheet resistance of silicon layer 14. Afterwards, electron-beam lithography and etching form source/drain (S/D) regions and a channel 18 connecting the source/drain (S/D) regions. Referring to FIG. 3B, there is a very thin wire (<80 nm) 18 between the source/drain (S/D) regions. The thin wire 18 connecting the source/drain (S/D) regions is used as the channel 18. Therefore, the top silicon layer 14 on the silicon-on-insulator (SOI) can be lithographically etched to define source/drain (S/D) regions and a channel 18 connecting the source/drain (S/D) regions.

Figure 4A:
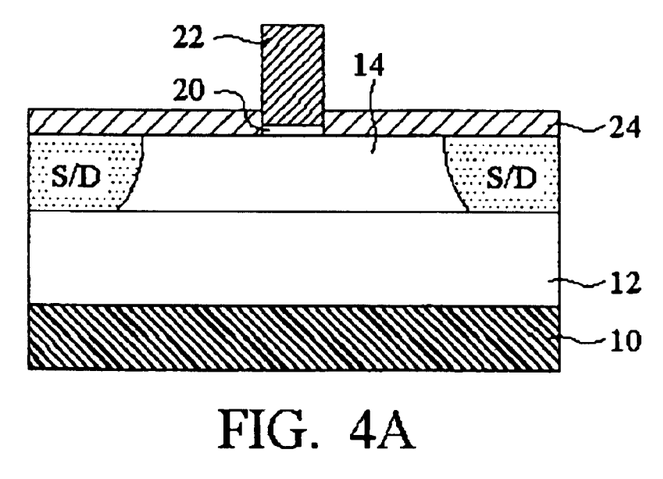
Figure 4B:
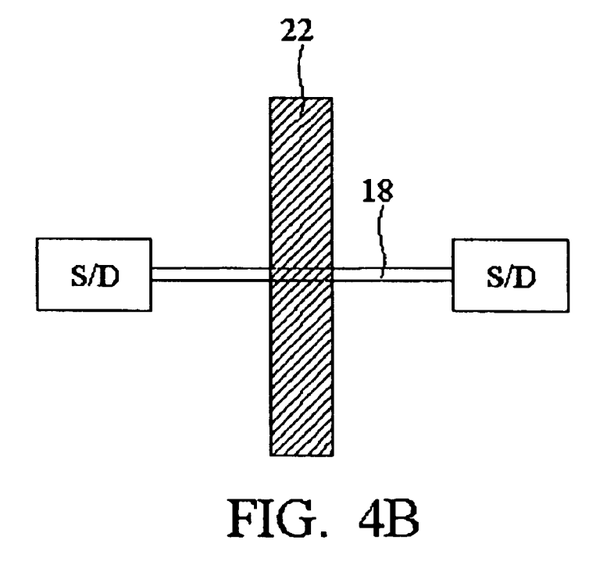

Referring to FIGS. 4A and 4B (top view of FIG. 4A), the thin silicon dioxide (not shown) is removed by HF solution. An insulating layer is subsequently deposited on the semiconductor layer 14. It is preferable that the insulating layer include silicon dioxide 20 thermally grown to a thickness between about 50 Å and about 70 Å. A TEOS SiO$_2$ layer 22 having a thickness of about 1000–2000 Å is then deposited, patterned using electron-beam lithography, and RIE-etched to form a thin SiO$_2$ line having a width of 80 nm or less perpendicular to the channel 18. To further reduce the TEOS width to 40 nm or less, the SOI substrate is dipped in diluted HF solution. Following this, agate insulating layer 24 preferably includes silicon dioxide (SiO$_2$) having a thickness of about 50–300 Å formed by CVD or oxidation.

Figure 5A:
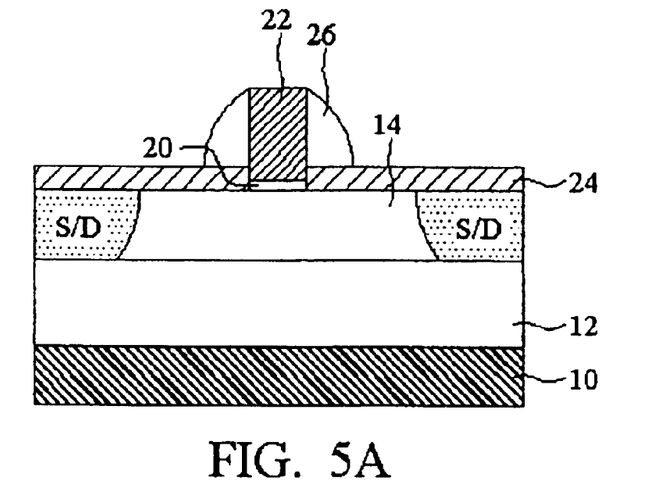
Figure 5B:
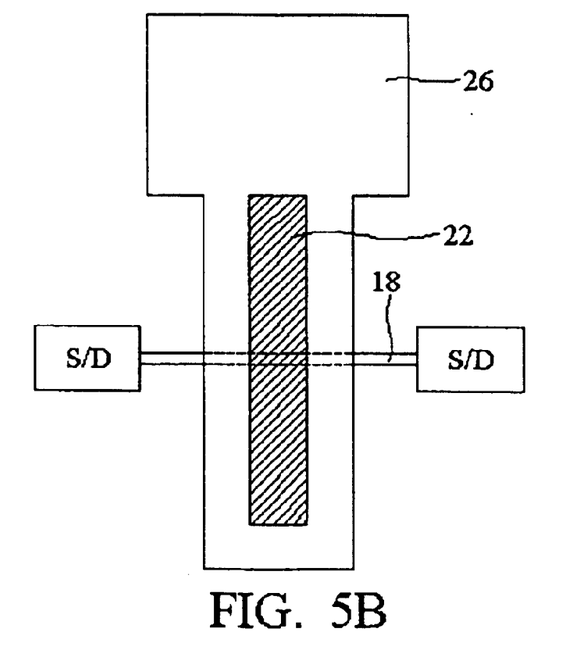

Referring to FIGS. 5A and 5B (top view of FIG. 5A), A polysilicon layer having a thickness of about 1000–2000 Å is deposited by CVD and dry-etched to form polysilicon spacer gates 26 having a width of about 50–90 nm on the sidewall of the thin SiO$_2$ wire, as shown in FIG. 5A. After the polysilicon is etched, the polysilicon layer on the sidewall of the thin SiO$_2$ wire remains as the spacer. The height and width are dependent on the height of the thin SiO$_2$ line and the time of etching the polysilicon layer. Because the polysilicon spacers are naturally formed on the sidewall of the thin SiO$_2$ line, the polysilicon spacers are self-aligned.

Figure 6:
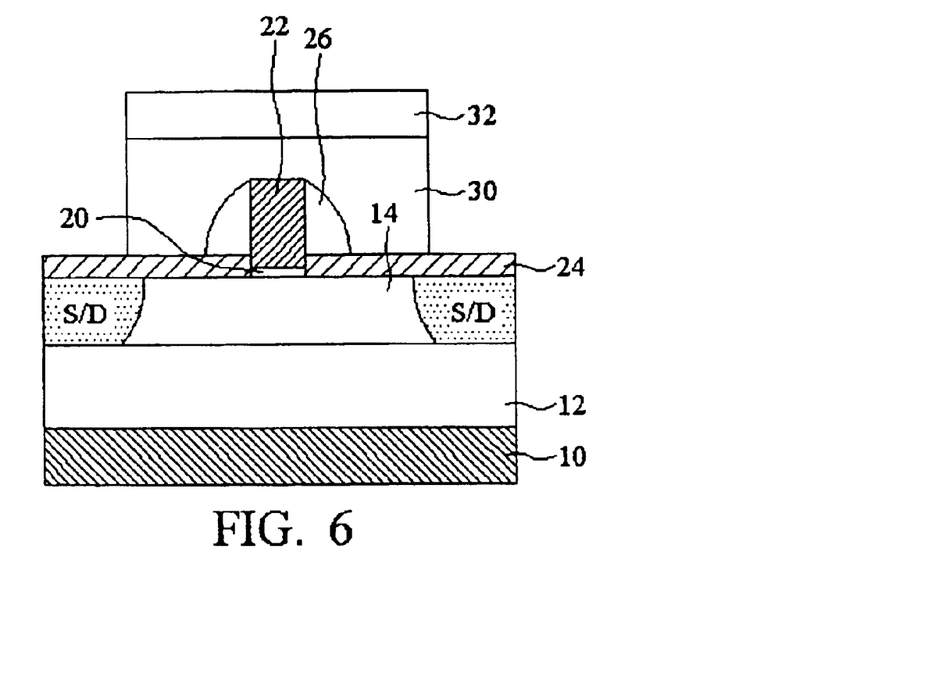

The present invention relates to a technique accomplishing the integration of a single-electron device including a single-electron transistor, a single-electron memory, and the like. FIG. 6 shows a schematic diagram of a backend process of fabricating a single electron transistor according to the present invention. Following FIGS. 5A and 5B, a blanket protecting layer 30, such as silicon nitride having a thickness of about 2000–5000 Å is formed on the substrate 10. Next, metal upper gate or Ohmic contact are formed by backend metallization or opening the contact via directly, thereby completing the formation of the transistor.

Accordingly, a nanometer scale single electron transistor is schematically shown in FIG. 6. The single electron transistor is formed on a silicon-on-insulator substrate 10. It is preferable that the silicon-on-insulator substrate 10 include a semiconductor layer 14 and a buried insulating layer 10 formed on a semiconductor wafer. The single-electron device, including source/drain regions, a channel 18, and dual polysilicon spacer gates 26, is formed on the silicon-on-insulator substrate 10. The source/drain regions and a channel 18 are defined by electron-beam lithographic etching. The dual polysilicon spacer gates 26 are separated by an insulating layer 22 and symmetric to each other on the sidewall of the insulating layer 22. The insulating layer 22 perpendicularly intersects the channel 18.

The electrical characteristics of the single electron transistor according to the present invention are described as follows.

The electrical characteristic simulation results were theoretically calculated by single electron transistor simulation software available from Delft Univ. of Technology, The Netherlands. Here, an explanation is given of the electrical characteristics of the single-electron transistor according to the present embodiment.

Figure 7:
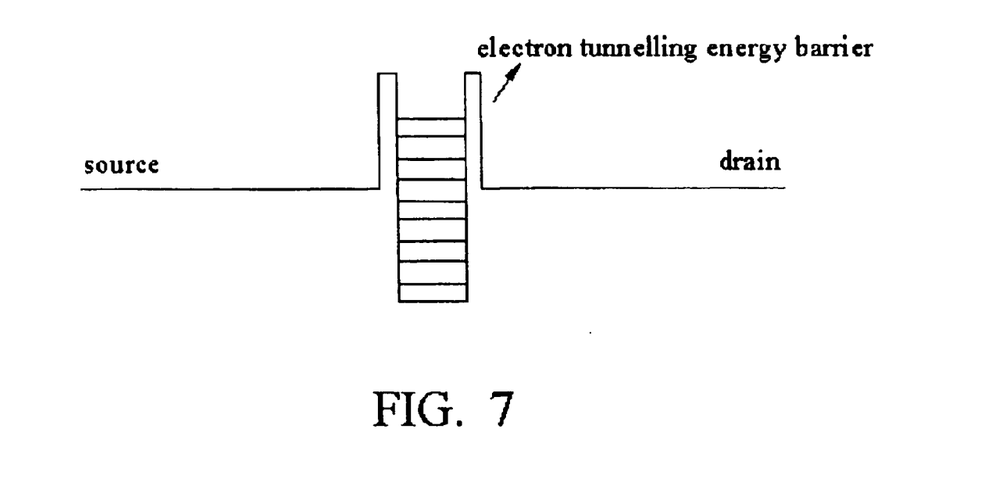
FIG. 7 shows the energy level of the single-electron transistor with self-aligned polysilicon sidewall spacer gates.
Figure 8:
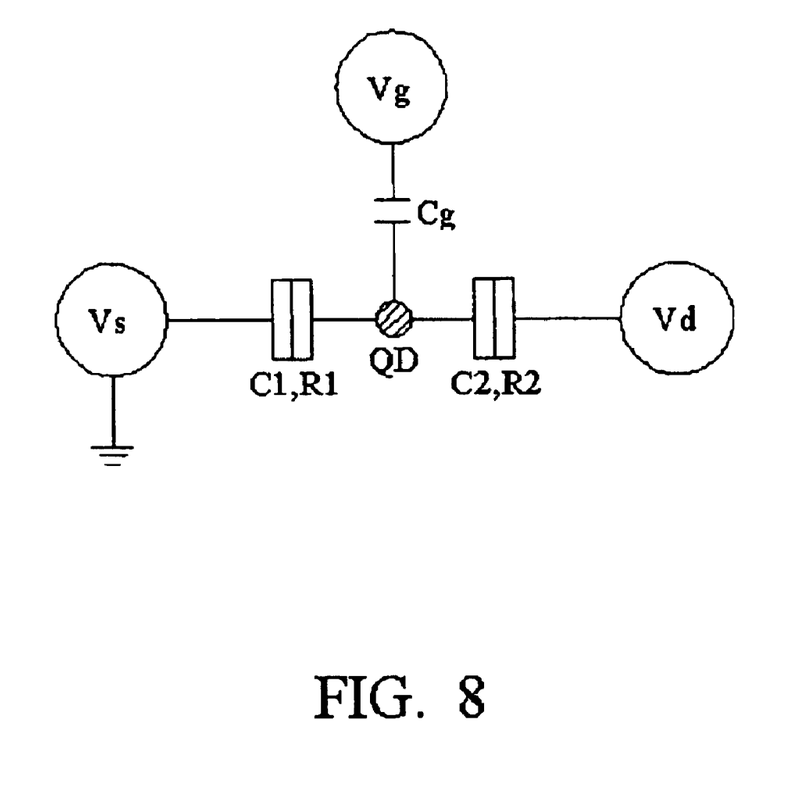
FIG. 8 shows the equivalent circuit of the single-electron transistor with self-aligned polysilicon sidewall spacer gates.
Figure 9A:
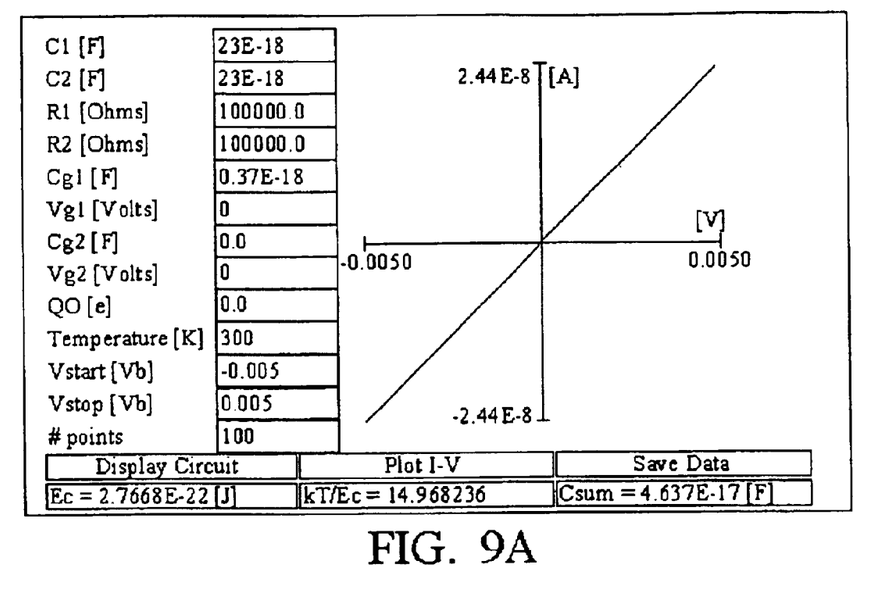
FIGS. 9A–9D show $I_d$-$V_d$ characteristics based on the simulated results.
Figure 9B:
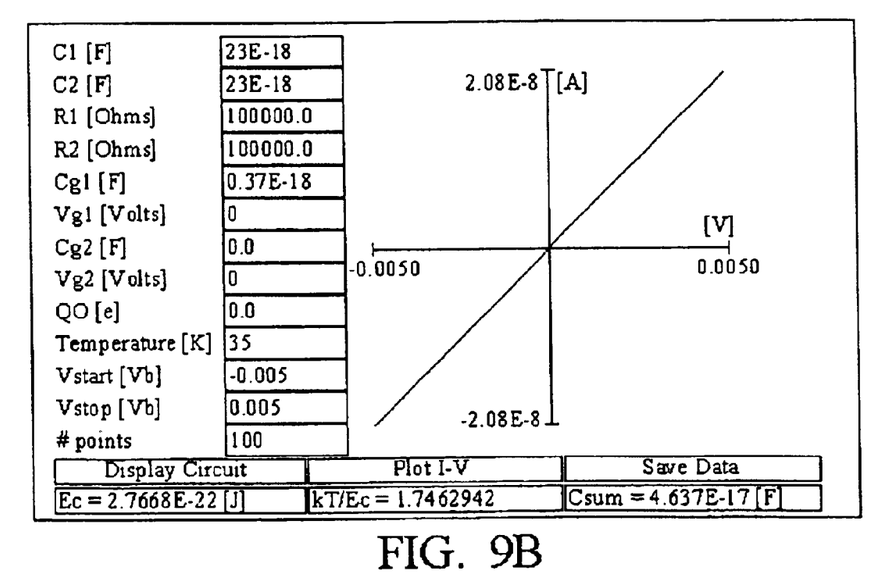
Figure 9C:
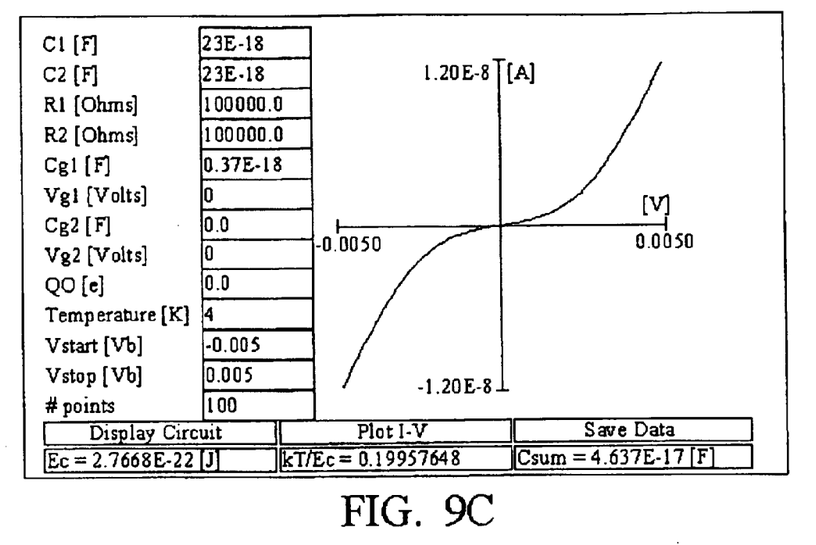
Figure 9D:
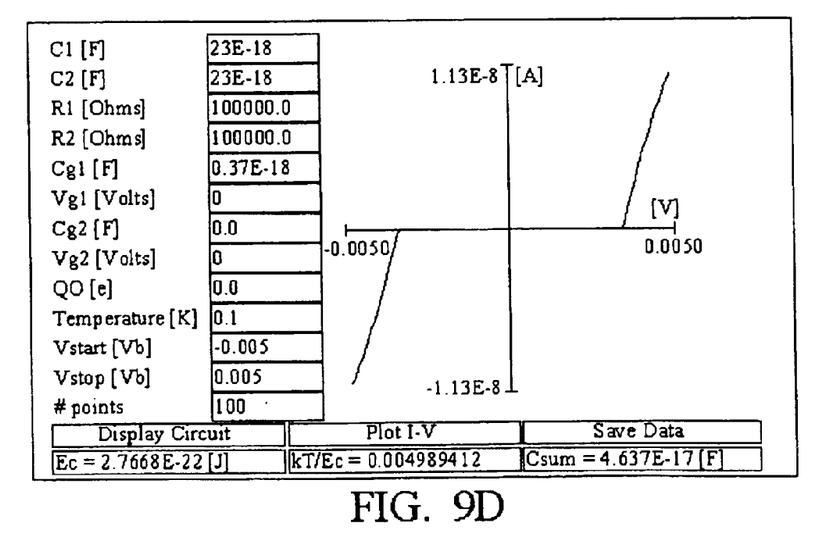
Figure 10A:
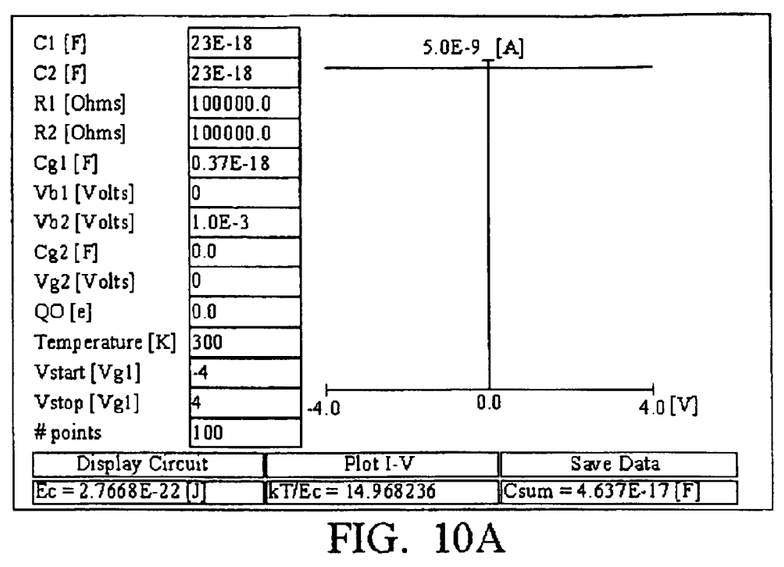
FIGS. 10A–10D show $I_d$-$V_g$ characteristics based on the simulated results.
Figure 10B:
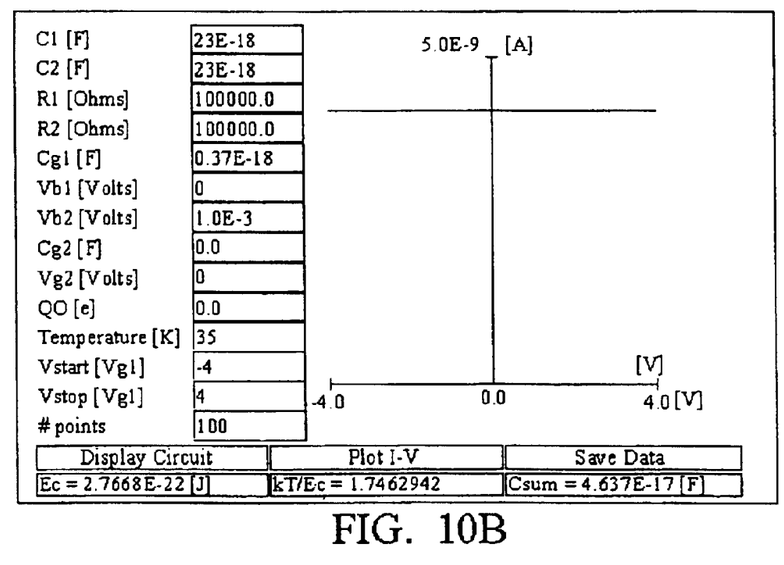
Figure 10C:
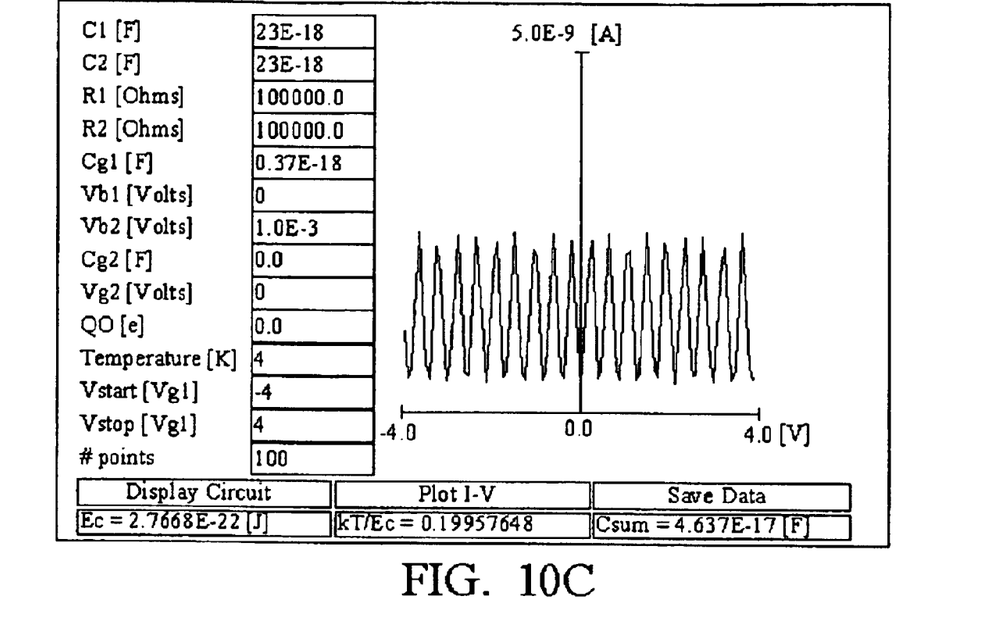
Figure 10D:
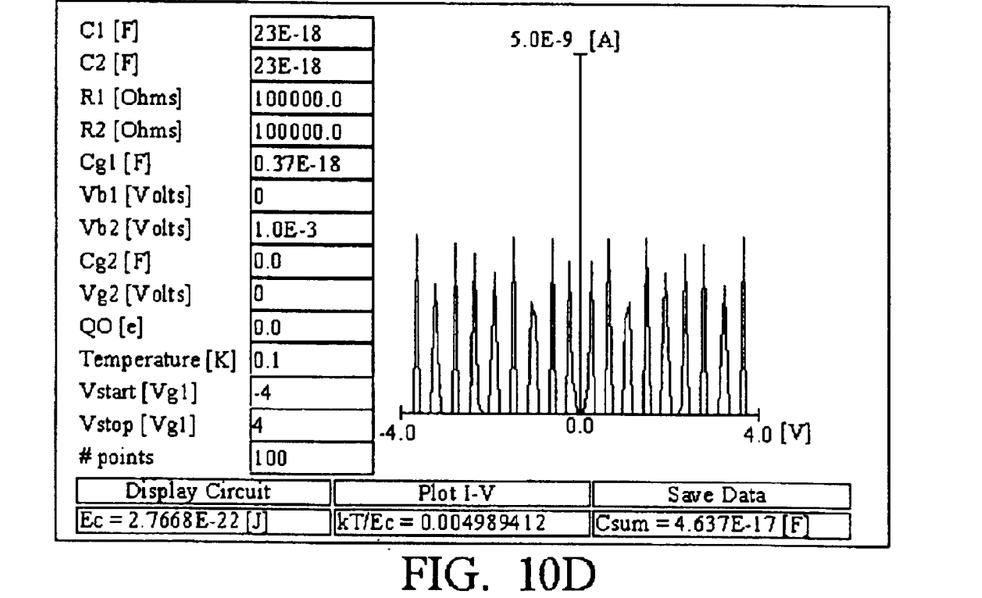

Active region structure is schematically shown in FIG. 6. The energy level of the single-electron transistor is depicted in FIG. 7. The equivalent circuit of the single-electron transistor is shown in FIG. 8, where $C_1=C_2=23$ aF, $C_g=0.37$ aF. In accordance with the equivalent circuit of the single-electron transistor, the capacitances are therefore calculated as:

$$C_1 = C_2 = \varepsilon_{ox}\frac{A_{lg}}{t_{ox}} = K_{ox}\varepsilon_o\frac{A_{lg}}{t_{ox}}$$
$$= (3.9 \times 8.845 \times 10^{-12}) \times \frac{84 \times 10^{-9} \times 80 \times 10^{-9}}{10 \times 10^{-9}} = 23aF$$

$$C_g = \varepsilon_{ox}\frac{A_{ug}}{t_{ug}} = \varepsilon_{ox}\frac{A_{ug}}{t_{ug}} = K_{ox}\varepsilon_o\frac{A_{ug}}{t_{ug}}$$
$$= (3.9 \times 8.845 \times 10^{-12}) \times \frac{40 \times 10^{-9} \times 80 \times 10^{-9}}{300 \times 10^{-9}} = 0.37aF$$

$$A_{lg} = W_{lg} \times W_{ch}$$
$$A_{ug} = W_{ox} \times W_{ch}$$

wherein C1, and C2 are the respective tunneling capacitances, and R1, R2 the respective tunneling resistances of each side of quantum dot.

$C_g$ is the capacitance of the upper gate, $A_{lg}$ is the area between lower gate and the channel, $T_{ox}$ is the thickness of the oxide between lower gate and the channel, $A_{ug}$ is the area between upper gate and the channel, and $T_{ug}$ is the thickness of the oxide between the upper gate and the channel.

$W_{lg}$ is the width of the polysilicon lower gate, for example, 84 nm, $W_{ch}$ is the width of the silicon channel, for example, 80 nm, and $W_{ox}$ is the width of the polysilicon wire, for example, 40 nm.

A description of the simulation parameters follows.

$C_1$, $C_2$ were the terminal capacitances of the source/drain, respectively, $R_1$, $R_2$ were the terminal resistances of the source/drain, respectively, $C_{g1}$ was the terminal capacitance of the upper gate, $V_{b1}$ was the source bias (initially o), $V_{b2}$ was the drain bias, $Q_0$ was the initial background electric charge, and temperature [K] the operating temperature.

$V_{start}$ was the initial voltage of the source, $V_{stop}$ the terminal voltage of the drain, and # of points represents the number of points based on the simulation.

Referring to FIGS. 9A–9D, $I_d$-$V_d$ characteristics based on the simulated results are shown. Coulomb blockade was observed at 4 K, and more clearly at 0.1 K.

Referring to FIGS. 10A–10D, $I_d$-$V_g$ characteristics based on the simulated results are shown. As the dimensions of single-electron devices downscale to the scales mentioned or less, the invention is operable based on the results of electric characteristic simulation at room temperature. Thus, further reduction of the single-electron device is promising with the proposed fabrication method leading to possible room temperature operation.

Figure 11A:
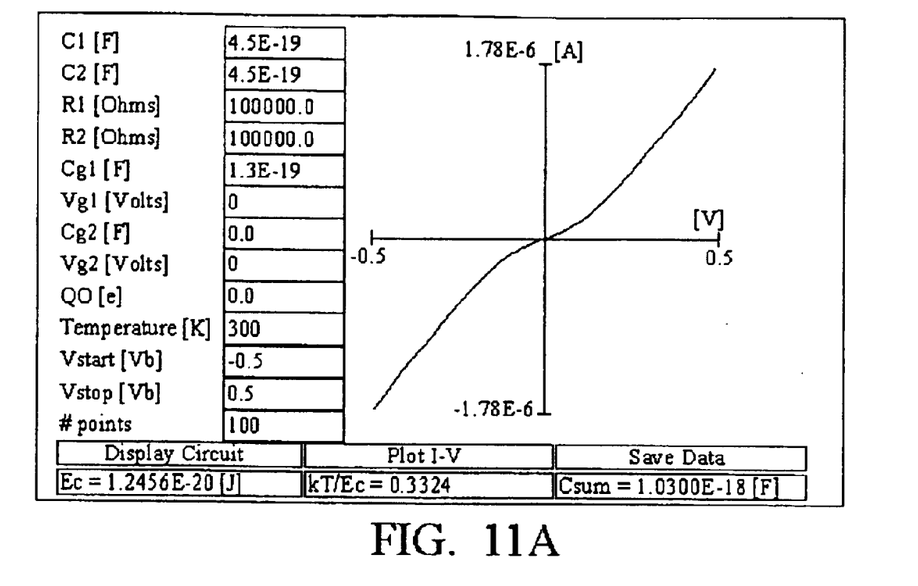
FIGS. 11A–11B show the operation of the electric characteristics of the single-electron transistor with self-aligned polysilicon sidewall spacer gates.
Figure 11B:
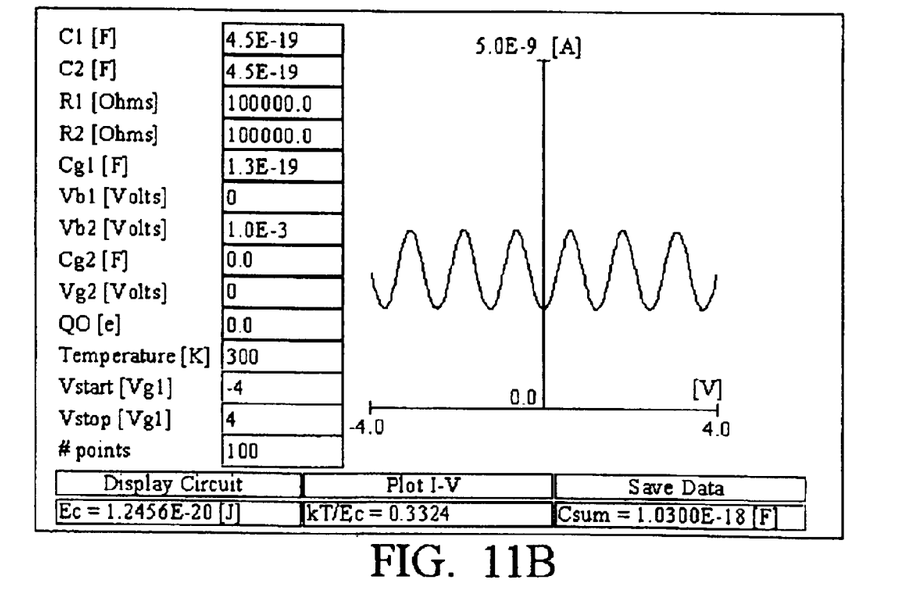

Referring to FIGS. 11A–11B, the electrical characteristics of the single-electron transistor with self-aligned polysilicon sidewall spacer gates is operable, with the assumption of the following dimensions for the single-electron transistor.

$T_{ox}$ is the thickness of the oxide between lower gate and the channel, for example, 30 nm, $T_{ug}$ is the thickness of the oxide between upper gate and the channel, for example, 100 nm, $W_{lg}$ is the width of the polysilicon lower gate, for example, 20 nm, $W_{ch}$ is the width of the silicon channel, for example, 20 nm, and $W_{ox}$ is the width of the polysilicon wire, for example, 20 nm.

The capacitances of the equivalent circuit are therefore calculated as:

$$C_1 = C_2 = \varepsilon_{ox} \frac{A_{lg}}{t_{ox}} = K_{ox}\varepsilon_o \frac{A_{lg}}{t_{ox}}$$
$$= (3.9 \times 8.845 \times 10^{-12}) \times \frac{20 \times 10^{-9} \times 20 \times 10^{-9}}{30 \times 10^{-9}} = 0.45 aF$$

$$C_g = \varepsilon_{ox} \frac{A_{ug}}{t_{ug}} = \varepsilon_{ox} \frac{A_{ug}}{t_{ug}} = K_{ox}\varepsilon_o \frac{A_{ug}}{t_{ug}}$$
$$= (3.9 \times 8.845 \times 10^{-12}) \times \frac{20 \times 10^{-9} \times 20 \times 10^{-9}}{100 \times 10^{-9}} = 0.13 aF$$

In the preferred embodiments described, the advantages of the single-electron transistor with self-aligned polysilicon sidewall spacer gates and fabrication method thereof according to the invention are as follows.

The method according to the invention is compatible with the state-of-the-art VLSI technology, comprising a combination of electron-beam (E-beam) lithography with multilayer aligned direct writing technology, oxidation and dry/wet etching processes to form a nanoscale one dimensional channel between source and drain on a silicon-on-insulator substrate.

The nanometer silicon dioxide wire is formed using E-beam lithographically etching process. To further reduce the width of the silicon dioxide wire, the nanometer silicon dioxide wire is further etched using diluted HF solution. Thus, reduction of space between the separated gates and capacitance of the quantum well, and increase in operating temperature, are achieved.

The polysilicon sidewall spacer gates with symmetric characteristics can be formed by are liable and stable self-aligned process.

A two-dimensional electron gas (2DEG) is created by selectively implanting $n^+$ ions into source/drain regions and controlling the bias on the metal upper gate. Thus, electrons are confined with in several nano-regions above the silicon channel while avoiding collision with the $n^+$ ions, increasing the electron migration velocity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A nanoscale single electron transistor, comprising:

a silicon-on-insulator substrate;

a dual polysilicon sidewall spacer gate on the silicon-on-insulator substrate; the dual polysilicon sidewall spacer gate separated and symmetric with an insulating layer;

a source/drain region within the silicon-on-insulator substrate; and a channel connecting the source/drain region.

2. The single electron transistor of claim 1, wherein the source/drain region and the channel are formed by electron-beam lithographic etching.

3. The single electron transistor of claim 1, wherein the width of the dual polysilicon sidewall spacer gate is about 10 nm to about 90 nm.

4. The single electron transistor of claim 1, wherein the insulating layer is perpendicular to the channel.

* * * * *